(12) United States Patent
Wang et al.

(10) Patent No.: US 11,063,158 B2
(45) Date of Patent: Jul. 13, 2021

(54) SENSORS HAVING RESISTIVE ELEMENTS

(71) Applicant: GLOBALFOUNDRIES Singapore Pte. Ltd., Singapore (SG)

(72) Inventors: Lanxiang Wang, Singapore (SG); Eng Huat Toh, Singapore (SG); Shyue Seng Tan, Singapore (SG); Kiok Boone Elgin Quek, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 16/716,419

(22) Filed: Dec. 16, 2019

(65) Prior Publication Data

US 2021/0184059 A1 Jun. 17, 2021

(51) Int. Cl.
*H01L 31/02* (2006.01)
*H01L 31/107* (2006.01)
*H01L 45/00* (2006.01)
*H01L 31/18* (2006.01)

(52) U.S. Cl.
CPC ...... *H01L 31/02027* (2013.01); *H01L 31/107* (2013.01); *H01L 31/18* (2013.01); *H01L 45/085* (2013.01); *H01L 45/1233* (2013.01); *H01L 45/1253* (2013.01); *H01L 45/146* (2013.01); *H01L 45/1608* (2013.01)

(58) Field of Classification Search
CPC . H01L 31/02027; H01L 31/107; H01L 31/18; H01L 45/1233; H01L 45/1253; H01L 45/146
See application file for complete search history.

(56) References Cited

U.S. PATENT DOCUMENTS

| 9,924,117 | B2 * | 3/2018 | Higashi | H01L 27/1469 |
| 10,271,000 | B2 * | 4/2019 | Noh | H04N 5/378 |
| 2010/0127314 | A1 | 5/2010 | Frach | |

OTHER PUBLICATIONS

A. Rochas et al., Single photon detector fabricated in a complementary metal-oxide-semiconductor high-voltage technology, Review of Scientific Instruments, Jul. 2003, 3263-3270, vol. 74, No. 7, American Institute of Physics, United States.
Justin A. Richardson et al., Low Dark Count Single-Photon Avalanche Diode Structure Compatible With Standard Nanometer Scale CMOS Technology, IEEE Photonics Technology Letters, Jul. 15, 2009, 1020-1022, vol. 21, No. 14, IEEE, New Jersey, United States.
G.Q. Zhang et al., Demonstration of a silicon photomultiplier with bulk integrated quenching resistors on epitaxial silicon, Nuclear Instruments and Methods in Physics Research A 621, 2010, 116-120, Elsevier, Amsterdam, Netherlands.
T. Nagano et al., Improvement of Multi-Pixel P, hoton Counter (MPPC), IEEE Nuclear Science Symposium Conference Record, 2011, 1657-1659, IEEE, New Jersey, United States.

(Continued)

*Primary Examiner* — Mark V Prenty
(74) *Attorney, Agent, or Firm* — David Cain

(57) ABSTRACT

A sensor is provided, which includes a semiconductor substrate, a photodiode region, and a multi-layered resistive element. The photodiode region is arranged in the semiconductor substrate. The multi-layered resistive element is arranged over the semiconductor substrate and is coupled with the photodiode region.

20 Claims, 5 Drawing Sheets

(56) References Cited

OTHER PUBLICATIONS

Eric A. G. Webster et al., A silicon photomultiplier with >30% detection efficiency from 450-750nm and 11.6μm pitch NMOS only pixel with 21.6% fill factor in 130nm CMOS, 2012, 238-241, IEEE, New Jersey, United States.
Woo-Suk Sul et al., Guard-Ring Structures for Silicon Photomultipliers, IEEE Electron Device Letters, Jan. 2010, 41-43, vol. 31, No. 1, IEEE, New Jersey, United States.

\* cited by examiner

SENSORS HAVING RESISTIVE ELEMENTS

FIELD OF THE INVENTION

The disclosed subject matter relates generally to semiconductor sensors, and more particularly to sensors having resistive elements and a method of forming the same.

BACKGROUND

Imaging sensors are widely used in digital still cameras, cellular phones, security cameras, as well as medical, automotive and other applications. Industrial demands for the imaging sensors are exponentially increasing, i.e., demands for higher resolution and lower power consumption. Such industrial demands require further device miniaturization, among other developments, of these imaging sensors.

Imaging sensors typically include light sensors or photodetectors to detect electromagnetic radiation. In particular, photodiode sensors are semiconductor devices that are able to detect wavelengths in visible and infrared spectrum regions of the electromagnetic wave spectrum. Photodiode sensors are often combined with logic electronics to convert detected photons into an output digitized voltage that can be read.

One type of photodiode sensor is a single-photon avalanche diode (SPAD) sensor, which is also often referred to as a Geiger-mode avalanche diode photodiode sensor. The SPAD sensor is a semiconductor device capable of detecting low-intensity light signals, such as a single photon. The SPAD sensor is based on a P-N junction operating under a high reverse-biased voltage that is above a breakdown voltage of the SPAD sensor. At this biased voltage, the SPAD sensor triggers a self-sustaining avalanche multiplication of charge carries after detecting a single photon, giving rise to a high self-sustaining avalanche current. The high avalanche current may cause damage to the SPAD sensor by overheating and must be "quenched". A resistive element is typically employed to provide a "quenching" resistance to "quench" the avalanche current by lowering the reverse-biased voltage to a level below the breakdown voltage of the SPAD sensor, thereby avoiding overheating of the SPAD sensor.

However, SPAD sensors fabricated on complementary metal-oxide-semiconductor (CMOS) technology have limited fill-factors as the resistive elements typically occupy valuable space on the same semiconductor substrate that the SPAD sensor is fabricated on. Therefore, there is a need to provide SPAD sensors and a method of forming the same to overcome, or at least ameliorate, the disadvantage described above.

SUMMARY

To achieve the foregoing and other aspects of the present disclosure, sensors and a method of forming the same are presented.

According to an aspect of the present disclosure, a sensor is provided, which includes a semiconductor substrate, a photodiode region, and a multi-layered resistive element. The photodiode region is arranged in the semiconductor substrate. The multi-layered resistive element is arranged over the semiconductor substrate and is coupled with the photodiode region.

According to another aspect of the present disclosure, a sensor is provided, which includes a semiconductor substrate, a photodiode region, and a multi-layered resistive element. The photodiode region is arranged in the semiconductor substrate. The multi-layered resistive element is arranged over the semiconductor substrate and is coupled with the photodiode region. The multi-layered resistive element includes a resistive random-access memory (ReRAM) structure.

According to yet another aspect of the present disclosure, a method of forming a sensor is provided, which includes providing a semiconductor substrate and forming a photodiode region in the semiconductor substrate. A multi-layered resistive element is formed over the semiconductor substrate and is coupled with the photodiode region.

BRIEF DESCRIPTION OF THE DRAWINGS

The embodiments of the present disclosure will be better understood from a reading of the following detailed description, taken in conjunction with the accompanying drawings.

Figure 1:
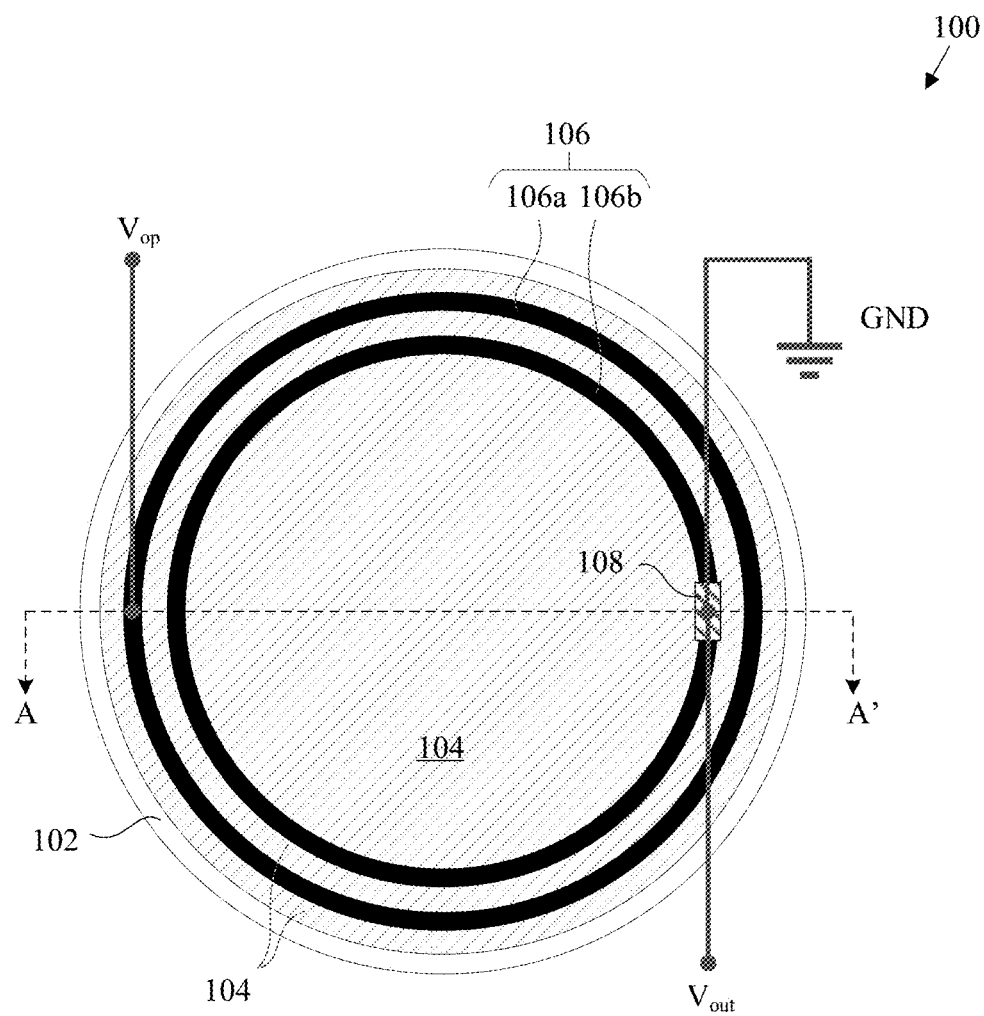
FIG. 1 is a simplified top view of a sensor, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the device. The same reference numerals in different drawings denote the same elements, while similar reference numerals may, but do not necessarily, denote similar elements. Additionally, it is noted that specific elements may be denoted by a reference numeral and a suffix, for example, 104a, 204b, etc. When those elements are referred to generically, merely the reference numerals are used, for example 104, 204, etc.

DETAILED DESCRIPTION

Various embodiments of the disclosure are described below. The embodiments disclosed herein are exemplary and not intended to be exhaustive or limiting to the disclosure.

The present disclosure relates to sensors having resistive elements, and more particularly, single-photon avalanche diode (SPAD) sensors having embedded multi-layered resistive elements and a method of forming the same. Aspects of the present disclosure are now described in detail with accompanying drawings.

FIG. 1 is a simplified top view of a SPAD sensor 100, according to an embodiment of the disclosure. The SPAD sensor 100 includes a semiconductor substrate 102, a photodiode region 104, a plurality of contact structures 106 and a resistive element 108. The SPAD sensor 100 may be in a circular shape as illustrated in FIG. 1. Those skilled in the art will understand the SPAD sensor 100 may be formed in other suitable shapes, such as a square or a rectangular.

The photodiode region 104 is formed in the semiconductor substrate 102. The plurality of contact structures 106 is formed over the photodiode region 104 and may be in a form of a cathode 106a and an anode 106b. The cathode 106a and the anode 106b may be spaced apart from each other. The cathode 106a and the anode 106b may be in a shape of a circular ring as illustrated in FIG. 1, or the cathode 106a and the anode 106b may take a form of other suitable shapes substantially corresponding to the shape of the SPAD sensor 100, such as a rectangular ring. In an embodiment of the disclosure, the contact structures 106 may be arranged over a periphery of the photodiode region 104 as shown in FIG. 1.

The anode 106b may be electrically connected with one end of the resistive element 108. An opposite end of the resistive element 108 may be electrically connected with a grounding conductor (GND). The anode 106b may further be electrically connected with an output node, where an output voltage ($V_{out}$) may be received by a readout circuit. The cathode 106a may be electrically connected with an input node where a reverse-biased operating voltage ($V_{op}$) may be applied to the SPAD sensor 100 for photon detection. At the reverse-biased operating voltage ($V_{op}$), a photon-generated carrier may trigger a high self-sustaining avalanche current in the photodiode region 104, which may be received by the readout circuit as the output voltage ($V_{out}$) in the form of an electrical pulse. The electrical pulse received by the readout circuit indicates the detection of an incoming photon.

Although FIG. 1 illustrates a simplified top view of the SPAD sensor 100, it is understood that the SPAD sensor 100 may be configured in other suitable arrangements, according to other embodiments of the disclosure. In an embodiment of the disclosure, the readout circuit may include a time-to-digital converter. For simplicity, the output node, the input node, the readout circuit, and interconnection lines are not shown in FIG. 1.

FIGS. 2A-2F are cross-sectional views of a partially processed SPAD sensor 200 (taken along a similar line A-A' in FIG. 1), illustrating a method of forming the SPAD sensor 200 having an embedded multi-layered resistive element, according to embodiments of the disclosure. Certain structures may be conventionally fabricated, for example, using known processes and techniques, and specifically disclosed processes and methods may be used to achieve individual aspects of the present disclosure.

Figure 2A:
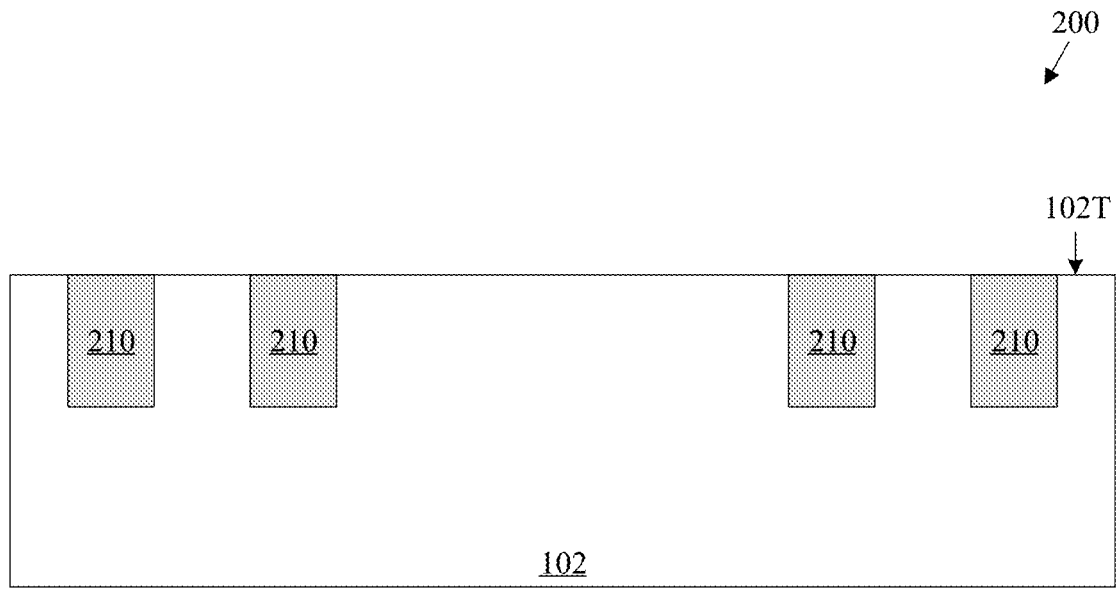
FIGS. 2A-2F are cross-sectional views of a partially processed sensor (taken along a similar line A-A' in FIG. 1), illustrating various stages of forming the sensor, according to embodiments of the disclosure.

As illustrated in FIG. 2A, the SPAD sensor 200 may include a semiconductor substrate 102 having a top substrate surface 102T and a plurality of isolation regions 210 formed in the semiconductor substrate 102. The plurality of isolation regions 210 is preferably capable of isolating conductive features to be formed in the semiconductor substrate 102. Each of the plurality of isolation regions 210 in this embodiment may be in a shape of a circular ring, and FIG. 2A is illustrated as the cross-sectional view through its widest part. The semiconductor substrate 102 may include any suitable semiconductor material, such as silicon, germanium, silicon-germanium, other II-VI or III-V semiconductor compounds and the like.

Figure 2B:
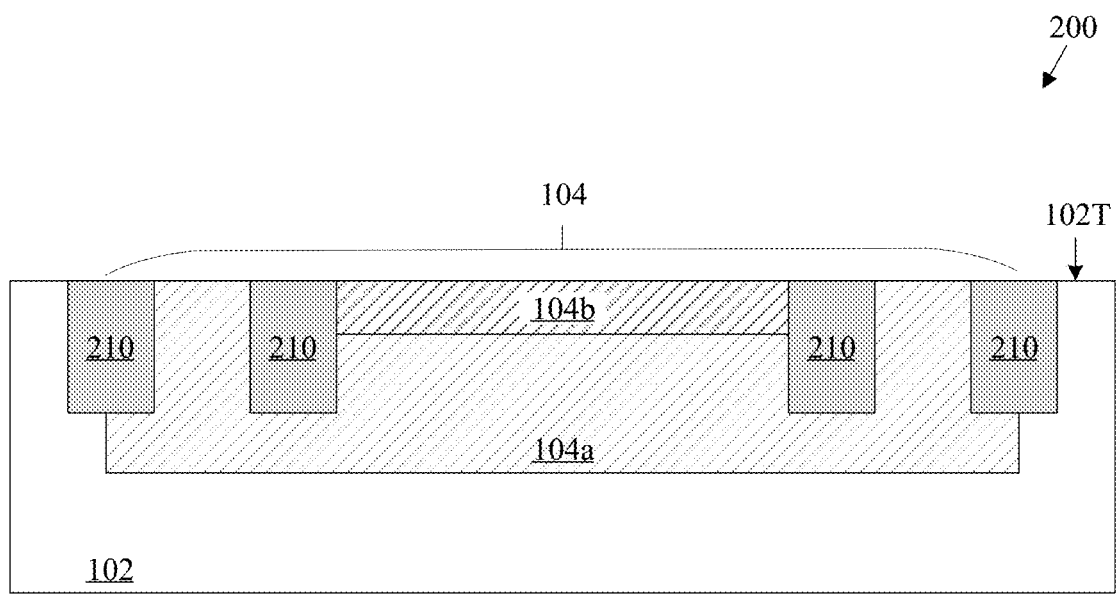

FIG. 2B illustrates the SPAD sensor 200 after forming a photodiode region 104 in the semiconductor substrate 102, according to an embodiment of the disclosure. The photodiode region 104 may be formed in the semiconductor substrate 102 by forming a first conductivity region 104a in the semiconductor substrate 102 with dopants having a first conductivity type, and forming a second conductivity region 104b in the semiconductor substrate 102 within the first conductivity region 104a with dopants having a second conductivity type. In an embodiment of the disclosure, the photodiode region 104 may be formed using suitable doping processes.

The photodiode region 104 may have a top surface extending to the top substrate surface 102T. In this embodiment of the disclosure, the first conductivity region of the photodiode region 104a is an N-type conductivity region doped with N-type dopants. The second conductivity region of the photodiode region 104b is a P-type conductivity region doped with P-type dopants. In some embodiments of the disclosure, the conductivity types of the first and the second conductivity regions (104a and 104b, respectively) may be reversed, so that the first conductivity region 104a and the second conductivity region 104b may be a P-type conductivity region and an N-type conductivity region, respectively. In some embodiments of the disclosure, the first conductivity region 104a and the second conductivity region 104b may be arranged in various suitable configurations to form the photodiode region 104.

In an embodiment of the disclosure, the N-type dopants may include phosphorous, arsenic, or other suitable N-type dopants. In another embodiment of the disclosure, the P-type dopants may include boron, gallium, or other suitable P-type dopants.

One or more suitable annealing processes may be performed to "activate" the first conductivity region 104a and the second conductivity region 104b. The annealing processes may include rapid thermal annealing (RTA) process, laser annealing process or other suitable annealing processes.

In some embodiments of the disclosure, the plurality of isolation regions 210 laterally separates the first conductivity region 104a and the second conductivity region 104b of the photodiode region 104. Further, the plurality of isolation regions 210 may be formed to separate the SPAD sensor 200 from adjacent conductive features.

In some embodiments of the disclosure, the SPAD sensor 200 may further include a guard ring arranged adjacent to the second conductivity region 104b of the photodiode region 104. The guard ring may minimize potential edge breakdown of the photodiode region 104. The guard ring may be a P-type conductivity region, in a shape substantially similar to the SPAD sensor 200. For simplicity, the guard ring is not shown in the accompanying drawings.

Figure 2C:
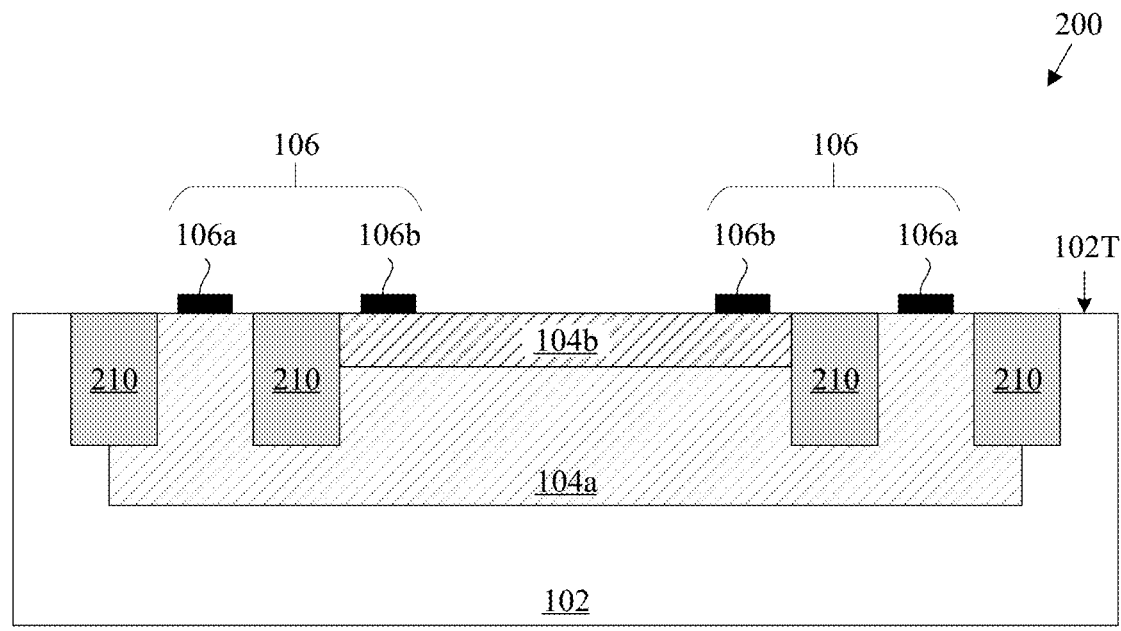

FIG. 2C illustrates the SPAD sensor 200 after forming contact structures 106 on the photodiode region 104, according to an embodiment of the disclosure. The contact structures 106 may be in a form of a cathode 106a and an anode 106b. The cathode 106a and the anode 106b in this embodiment may be in a shape of a circular ring, as illustrated in FIG. 1, and FIG. 2C is illustrated as the cross-sectional view through its widest part. In some embodiments of the disclosure, the contact structures 106 include silicide materials.

In some embodiments of the disclosure, the SPAD sensor 200 may further include a doped region arranged in the photodiode region 104 and under the cathode 106a. The doped region may be an N-type doped region, in a shape substantially similar to the SPAD sensor 200. For simplicity, the doped region is not shown in the accompanying drawings.

The cathode 106a may be formed over and electrically connected with the N-type conductivity region of the photodiode region 104, i.e., the first conductivity region 104a in this embodiment of the disclosure, and the anode 106b may be formed over and electrically connected with the P-type conductivity region of the photodiode region 104, i.e., the second conductivity region 104b in this embodiment of the disclosure. It will be understood by those skilled in the art that the locations of the cathode and the anode may be exchanged where the first conductivity region is a P-type conductivity region and the second conductivity region is an N-type conductivity region.

Figure 2D:
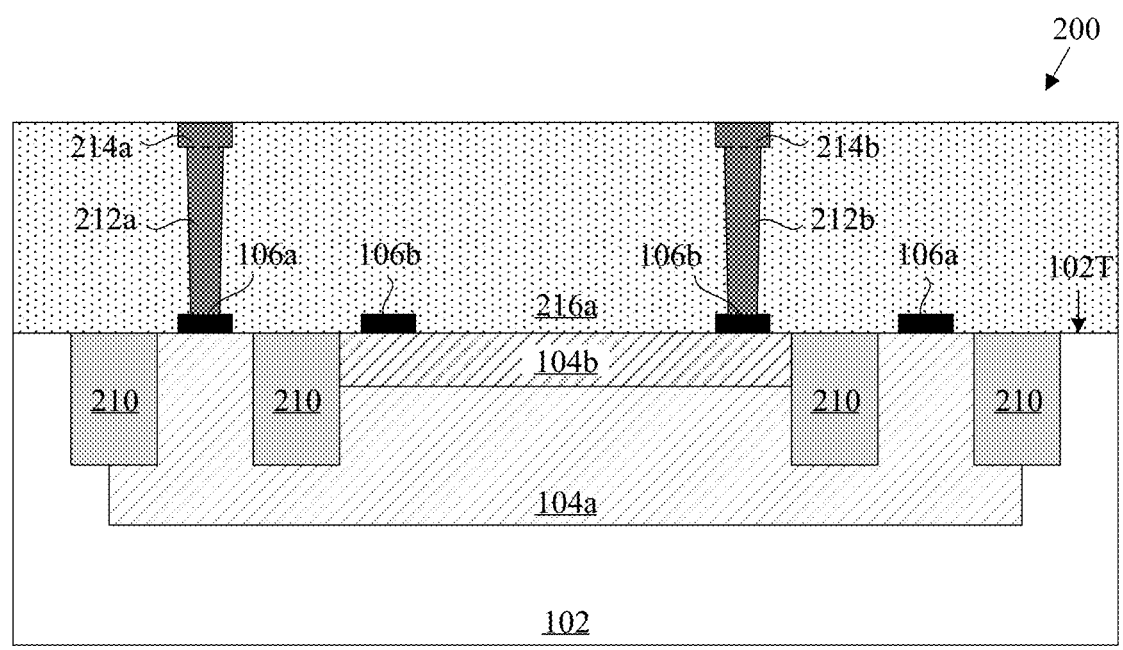

FIG. 2D illustrates the SPAD sensor 200 after forming interconnect via structures 212 (i.e., 212a and 212b, respectively) and interconnect line structures 214 (i.e., 214a and 214b, respectively), according to an embodiment of the disclosure. The interconnect via structures 212 and the interconnect line structures 214 are conductive features that enable the photodiode region 104 to be electrically connected with other semiconductor components (not shown), for example, a readout circuit.

The interconnect via structures 212 and the interconnect line structures 214 may be formed by a dual-damascene process described herein. A first dielectric layer 216a may be deposited over the semiconductor substrate 102 and the contact structures 106. Via openings (not shown) and trench openings (not shown) may be formed in the dielectric layer 216a using a multi-step material removal process. A conductive material may be deposited in the via openings (not shown) and the trench openings (not shown) in a one-step deposition process to form the interconnect via structures 212 and the interconnect line structures 214, respectively. In an embodiment of the disclosure, the conductive material may be copper.

The interconnect via structure 212a and the interconnect line structure 214a are formed over and electrically connected with the cathode 106a. The interconnect via structure 212b and the interconnect line structure 214b are formed over and electrically connected with the anode 106b. The interconnect line structure 214a may be configured to be electrically connected to an input node to receive a reverse-biased operating voltage ($V_{op}$) to be applied to the photodiode region 104. For simplicity, the input node and interconnection structures associated with the electrical connections are not shown in FIG. 2D.

Additionally not shown in FIG. 2D, one or more liners may be deposited during the formation of the interconnect via and the interconnect line structures. For instance, an adhesion liner and/or a barrier liner may be deposited in the via and the trench openings before the conductive material deposition. The adhesion liner may include metal silicides, such as titanium silicide, nickel silicide or other suitable adhesion material having any suitable thickness. The barrier liner may include metal nitrides, such as titanium nitride, tantalum nitride or other suitable barrier material having any suitable thickness.

Figure 2E:
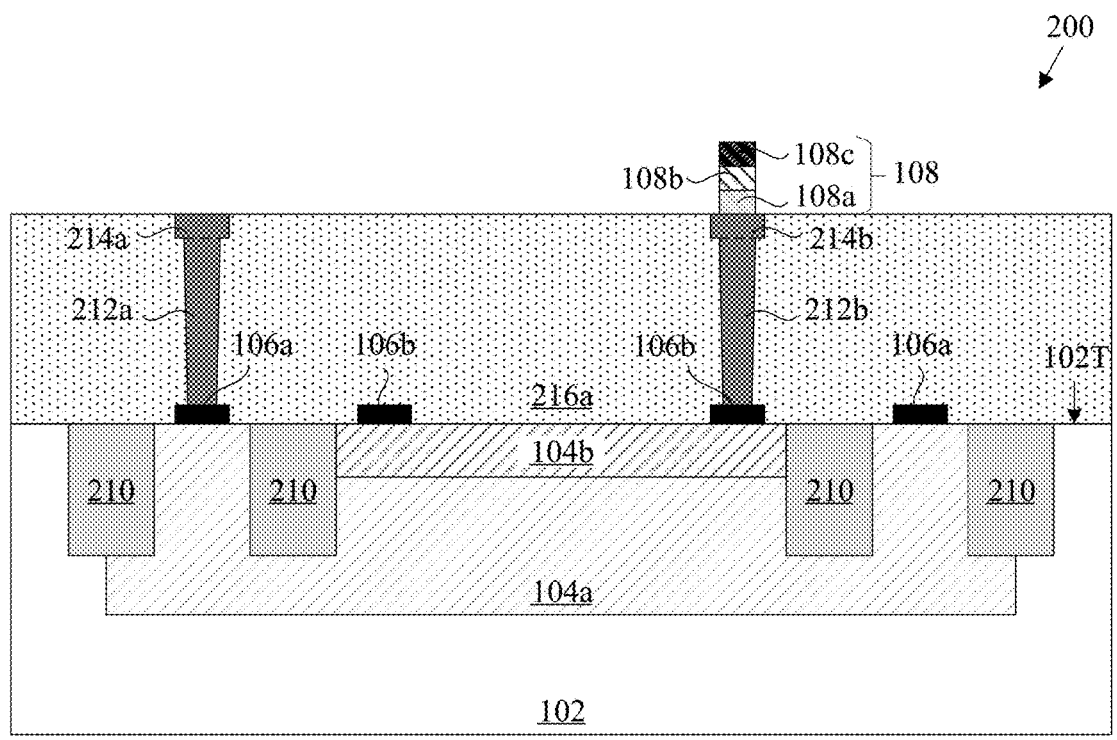

FIG. 2E illustrates the SPAD sensor 200 after forming a multi-layered resistive element 108, according to an embodiment of the disclosure. The multi-layered resistive element 108 may include a bottom electrode 108a, a top electrode 108c, and a resistive layer 108b in between the bottom electrode 108a and the top electrode 108c. The multi-layered resistive element 108 may be configured to have a resistive random-access memory (ReRAM) structure, although the multi-layered resistive element 108 may not function as a ReRAM cell.

The multi-layered resistive element 108 may be formed concurrently with the fabrication of a ReRAM structure (not shown) on other regions of the semiconductor substrate 102. The multi-layered resistive element 108 and the ReRAM structure (not shown) may be fabricated using complementary metal-oxide-semiconductor (CMOS) technology-compatible processes, which are relatively low-cost and involve relatively low complexity processes, thereby enabling other semiconductor components, such as logic and transistor devices, to be integrated together on a semiconductor chip.

The resistive layer in the multi-layered resistive element 108b is preferably a high resistance material that is suitable to "quench" the self-sustaining avalanche current during the operation of the SPAD sensor 200. The resistive layer in the multi-layered resistive element 108b is also preferably a material capable of withstanding a high operating voltage without breaking down, thereby advantageously maintaining the integrity of the multi-layered resistive element 108 during the operation of the SPAD sensor 200 under a high reverse-biased voltage. The resistive layer 108b may be easily deposited to a desired thickness through process control of the fabrication process, thereby providing engineering flexibility to control the desired level of "quenching" resistance optimal for the SPAD sensor 200; the thicker the resistive layer, a higher resistance is provided by the resistive layer. In an embodiment of the disclosure, the resistive layer 108b has a "quenching" resistance of at least 100 kΩ.

The multi-layered resistive element 108 may be fabricated by an exemplary process described herein. A layer of bottom electrode material is deposited over the first dielectric layer 216a and the interconnect line structures 214 using a suitable deposition process, such as a physical vapor deposition (PVD) process, a chemical vapor deposition (CVD) process, an atomic layer deposition (ALD) process, or other suitable deposition processes. The layer of bottom electrode material is patterned using a suitable lithographic process, leaving a portion of the bottom electrode material over the interconnect line structure 214b, forming the bottom electrode of the multi-layered resistive element 108a. The bottom electrode 108a is electrically coupled to the anode 106b. In an embodiment of the disclosure, the bottom electrode 108a material may be a conductive material, including platinum, titanium, titanium nitride, or other suitable conductive materials having a suitable thickness.

Following the formation of the bottom electrode 108a, a layer of resistive material is thereafter deposited and patterned, forming the resistive layer 108b over the bottom electrode 108a. The layer of resistive material may be deposited using a suitable deposition process, such as a PVD process, a CVD process, an ALD process, or other suitable deposition processes. In an embodiment of the disclosure, the resistive material may be a metal oxide material, including nickel oxide, titanium oxide, zinc oxide, zirconium oxide, hafnium oxide, or other suitable metal oxide materials having a suitable thickness.

In some embodiments of the disclosure, the resistive layer 108b may include an electrolyte layer and a cationic layer above the electrolyte layer. The cationic layer may serve as a reservoir to provide cations such as, but not limited to, copper ions.

A layer of top electrode material is subsequently deposited over the resistive layer 108b and patterned, leaving a portion of the top electrode material over the resistive layer 108b, forming the top electrode of the multi-layered resistive element 108c. In an embodiment of the disclosure, the top electrode material may be a conductive material including platinum, titanium nitride, strontium ruthenium trioxide, or other suitable conductive materials having a suitable thickness.

Although the bottom electrode 108a, the resistive layer 108b, and the top electrode 108c are illustrated in FIG. 2E as having a same width and a same thickness, the widths and thicknesses of the bottom electrode 108a, the resistive layer 108b and the top electrode 108c may be different. In some embodiments of the disclosure, the bottom electrode 108a, the resistive layer 108b, and the top electrode 108c may have thicknesses of at most 100 nm, 20 nm, and 100 nm, respectively.

Figure 2F:
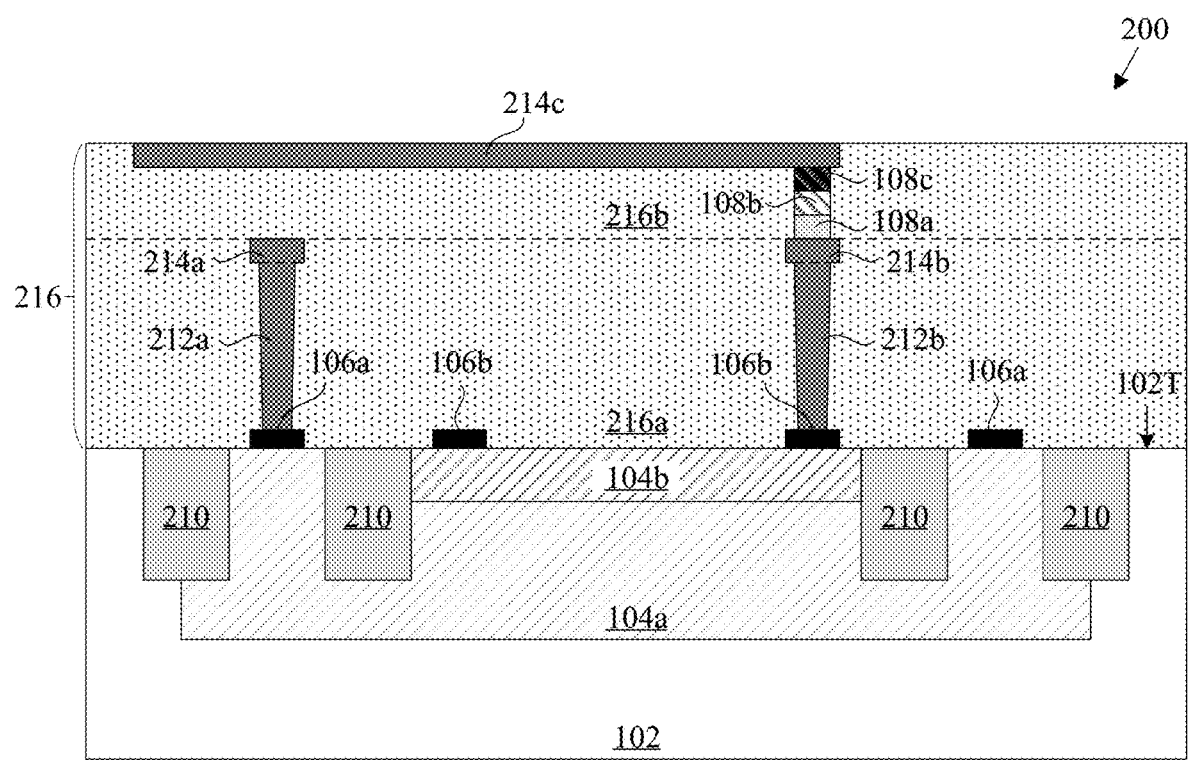

FIG. 2F illustrates the SPAD sensor 200 after forming a grounding conductor 214c, according to an embodiment of the disclosure. The multi-layered resistive element 108 may have one terminal, i.e., the top electrode 108c, electrically connected with the grounding conductor 214c. The multi-layered resistive element 108 may have an opposite terminal, i.e., the bottom electrode 108a, electrically connected with the anode 106b through the interconnect line and interconnect via structures (214b and 212b, respectively). The grounding conductor 214c may further be electrically connected with other semiconductor components, such as logic and transistor devices, to be integrated together on a semiconductor chip.

The grounding conductor 214c may be an interconnect line structure electrically connected with a grounding terminal. The grounding conductor 214c may be fabricated by an exemplary process described herein. A second dielectric layer 216b may be deposited over the multi-layered resistive element 108 using a suitable deposition process, for example, a CVD process, or other suitable deposition processes. The second dielectric layer 216b is preferably formed of the same dielectric material as the first dielectric layer 216a, and an interface between the first dielectric layer 216a and the second dielectric layer 216b is demarcated by a dashed line. The first dielectric layer 216a and the second dielectric layer 216b form an inter-layer dielectric (ILD) layer 216 of the SPAD sensor 200. A trench opening (not shown) may be formed over the resistive element 108 in the second dielectric layer 216b. A conductive material may be deposited in the trench opening (not shown) to form the grounding conductor 214c using a suitable deposition process, for example, a PVD process, a CVD process, an ALD process, or other suitable deposition processes. A suitable planarization process may be employed to form a substantially planar top surface of the grounding conductor 214c.

The SPAD sensor 200 may be configured to function with back-side illumination, i.e., photons to be detected by the SPAD sensor 200 is provided through the semiconductor substrate 102 to the photodiode region 104, or the SPAD sensor 200 may be configured to function with front-side illumination, i.e., photons to be detected by the SPAD sensor 200 is provided through the ILD 216. In an embodiment of the disclosure, the SPAD sensor 200 is preferably configured to function with back-side illumination. A greater area of the photodiode region 104 may be available for photon detection using back-side illumination. Illumination from the front-side of the SPAD sensor 200 may be shielded by the multi-layered resistive element 108, the plurality of interconnect via structures 212, the plurality of interconnect line structures 214, among other structures, thereby reducing the photo-detection efficiency of the SPAD sensor 200.

Figure 3:
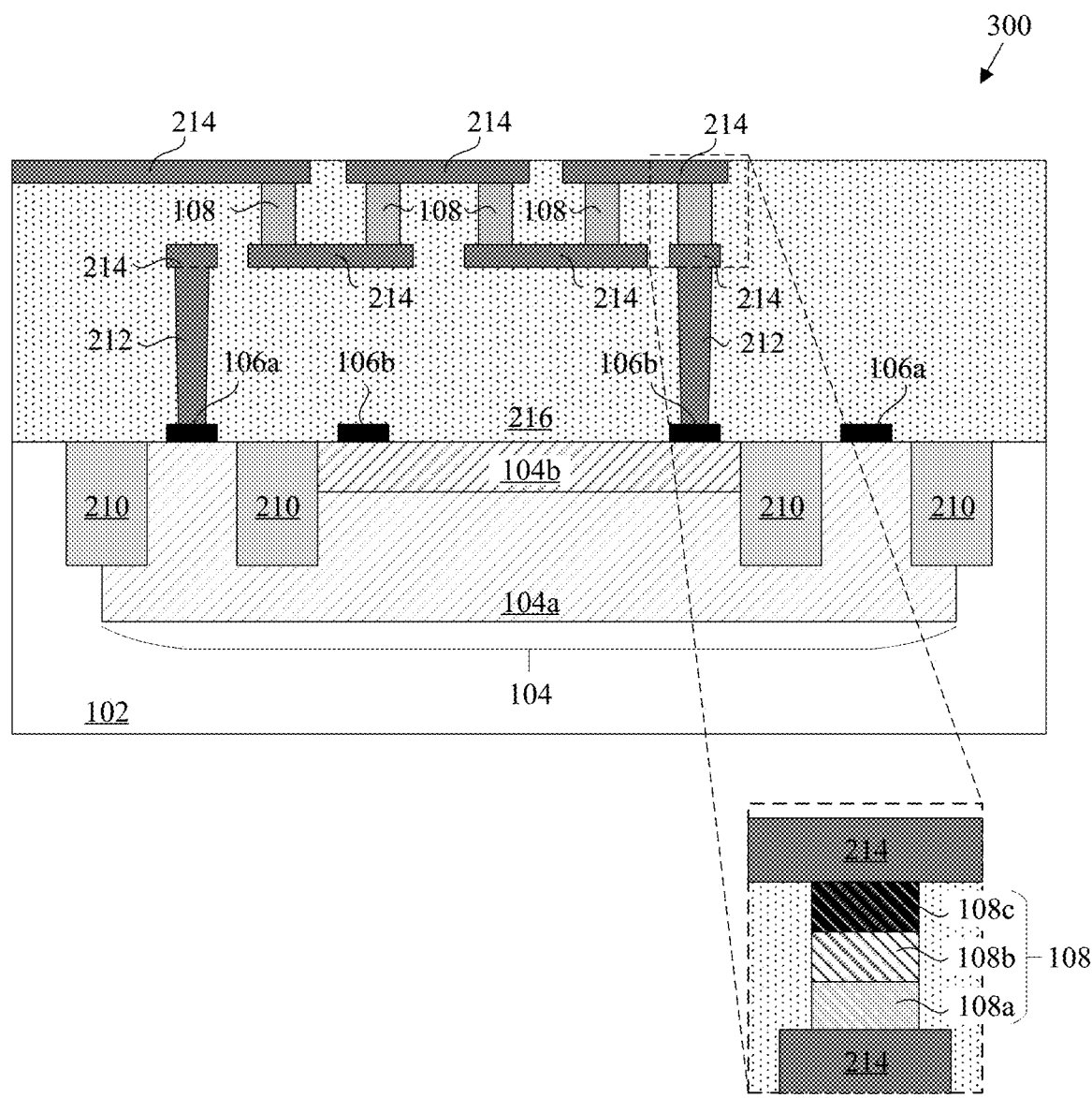
FIG. 3 includes a cross-sectional view of a sensor, according to an embodiment of the disclosure.

FIG. 3 illustrates a cross-sectional view of a SPAD sensor 300 (taken along a similar line A-A' in FIG. 1), according to another embodiment of the disclosure. The SPAD sensor 300 may include a semiconductor substrate 102 and a plurality of isolation regions 210 formed in the semiconductor substrate 102. Each of the plurality of isolation regions 210 may be in a shape of a circular ring, a rectangular ring or other suitable shapes substantially corresponding to the shape of the SPAD sensor 300. A photodiode region 104 may be formed in the semiconductor substrate 102 and the photodiode region 104 may include an N-type conductivity region 104a and a P-type conductivity region 104b.

Contact structures 106 may be formed over the photodiode region 104. The contact structures 106 may be in a shape of a circular ring, a rectangular ring or other suitable shapes substantially corresponding to the shape of the SPAD sensor 300. The contact structures 106 may be arranged over the periphery of the photodiode region 104. FIG. 3 is illustrated as the cross-sectional view of the SPAD sensor 300 through its widest part. The contact structures 106 may include a cathode 106a and an anode 106b. The cathode 106a may be arranged over and electrically connected with the N-type conductivity region of the photodiode region 104a. The anode 106b may be arranged over and electrically connected with the P-type conductivity region of the photodiode region 104b.

A plurality of interconnect via structures 212, a plurality of interconnect line structures 214, and a plurality of multi-layered resistive elements 108 may be arranged over the photodiode region 104 in an ILD layer 216 of the SPAD sensor 300. The plurality of multi-layered resistive elements 108 may be electrically connected in series with the photodiode region 104 through the anode 106b. The plurality of interconnect via structures 212 and the plurality of interconnect line structures 214 may be configured to provide electrical connections between the photodiode region 104 and the plurality of multi-layered resistive elements 108, and also between the photodiode region 104 and other semiconductor components, among other electrical connections. The plurality of multi-layered resistive elements 108 may be additionally electrically connected with each other through the plurality of interconnect line structures 314.

Advantageously, the overall resistance of the SPAD sensor 300 may be controlled by means of the present configuration. The overall resistance of the SPAD sensor 300 is equal to an algebraic sum of the individual resistances of each of the multi-layered resistive elements 108. Although FIG. 3 illustrates five multi-layered resistive elements 108, it will be understood that the SPAD sensor 300 may include any number of multi-layered resistive elements, as long as the overall "quenching" resistance provided by the multi-layered resistive elements 108 is sufficient to "quench" the SPAD sensor 300 during operation.

In an embodiment of the disclosure, the SPAD sensor 300 is preferably configured to receive photons through the semiconductor substrate 102 to the photodiode region 104, i.e., the SPAD sensor 300 is preferably back-side illuminated. A greater area of the photodiode region 104 may be available for photon detection using back-side illumination as illumination from the front-side of the SPAD sensor 300 may be shielded by the plurality of multi-layered resistive elements 108 and the plurality of interconnect via and line structures (212 and 214, respectively). The photo-detection efficiency of the SPAD sensor 300 may be expected to be higher for back-side illumination detection than that of front-side illumination detection.

In another embodiment of the disclosure, the multi-layered resistive element 108 may be configured to have a ReRAM structure, although the multi-layered resistive element 308 may not function as a ReRAM cell. The multi-layered resistive element 108 may include a bottom electrode 108a, a resistive layer 108b over the bottom electrode 108a and a top electrode 108c over the resistive layer 108b.

As described above, the multi-layered resistive element 108, which can be fabricated using CMOS technology-compatible processes which are relatively low cost and involve relatively low complexity processes, may be embedded in the ILD layer 216 of the SPAD sensor 300 to provide the "quenching" resistance during the operation of the SPAD sensor 300. The resistive layer 108b of the multi-layered resistive element may be a high resistance material that has the capability to stop the self-sustaining avalanche current to avoid damages to the SPAD sensor 300 and prepare the SPAD sensor 300 to detect a subsequent photon.

In an embodiment of the disclosure, the plurality of multi-layered resistive elements 108 may be electrically connected in series with the photodiode region 104. One terminal of the plurality of multi-layered resistive elements 108 may be grounded (GND), and an opposite terminal of the plurality of multi-layered resistive elements 108 may be electrically connected with the photodiode region 104 through the anode 106b. The anode 106b may further be electrically connected with an output node, where an output voltage ($V_{out}$) may be received by a readout circuit. A reverse-biased operating voltage ($V_{op}$) may be applied to the cathode 106a to reversely bias the photodiode region 104. Although FIG. 3 illustrates a cross-sectional view of the SPAD sensor 300, it is understood that the SPAD sensor 300 may be configured in other suitable arrangements, according to other embodiments of the disclosure.

As presented in the above detailed description, a SPAD sensor having an embedded multi-layered resistive element and a method of forming the same are presented. The multi-layered resistive element is embedded in an ILD layer of the SPAD sensor that may be arranged over a photodiode region of the SPAD sensor. The multi-layered resistive element may be configured to have a ReRAM structure that includes a bottom electrode, a top electrode and a resistive layer between the bottom and top electrodes. The resistive layer is capable of withstanding a high biased operating voltage, thereby advantageously maintaining the integrity of the multi-layered resistive element during the operation of the SPAD sensor under a high reverse-biased voltage. Additionally, the resistive layers of the multi-layered resistive elements are high resistance materials that are suitable to "quench" the self-sustaining avalanche current during the operation of the SPAD sensor. Thicknesses of the resistive layers may be easily controlled during the fabrication process to achieve a desired level of "quenching" resistance for the SPAD sensor to operate optimally.

Further, the SPAD sensor is fabricated on CMOS technology-compatible processes, which are relatively low cost and involve relatively low complexity processes. Embedding a resistive element within a SPAD sensor advantageously reduces valuable space typically taken up by a discrete resistive element on the semiconductor chip.

The terms "top", "bottom", "over", "under", and the like in the description and in the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

While several exemplary embodiments have been presented in the above detailed description of the device, it should be appreciated that a number of variations exist. It should further be appreciated that the embodiments are only examples, and are not intended to limit the scope, applicability, dimensions, or configuration of the device in any way. Rather, the above detailed description will provide those skilled in the art with a convenient road map for implementing an exemplary embodiment of the device, it being understood that various changes may be made in the function and arrangement of elements and method of fabrication described in an exemplary embodiment without departing from the scope of this disclosure as set forth in the appended claims.

What is claimed is:

1. A sensor comprising:
   a semiconductor substrate;
   a photodiode region arranged in the semiconductor substrate; and
   a multi-layered resistive element arranged over the semiconductor substrate and coupled with the photodiode region, wherein the multi-layered resistive element comprises a bottom electrode, a resistive layer arranged over the bottom electrode, and a top electrode arranged over the resistive layer.

2. The sensor of claim 1, wherein the multi-layered resistive element comprises a resistive random-access memory (ReRAM) structure.

3. The sensor of claim 1, wherein the resistive layer comprises nickel oxide, titanium oxide, zinc oxide, hafnium oxide, or zirconium oxide.

4. The sensor of claim 1, wherein the resistive layer comprises an electrolyte layer and a cationic layer.

5. The sensor of claim 1, wherein the bottom electrode comprises platinum, titanium or titanium nitride.

6. The sensor of claim 1, wherein the top electrode comprises platinum, titanium nitride, or strontium ruthenium trioxide.

7. The sensor of claim 1, further comprising:
   an anode coupled with a P-type conductivity region of the photodiode region; and
   a cathode coupled with an N-type conductivity region of the photodiode region, wherein the anode and the cathode are spaced apart from each other and are arranged over a periphery of the photodiode region.

8. The sensor of claim 7, wherein the multi-layered resistive element is coupled with the P-type conductivity region of the photodiode region through the anode.

9. The sensor of claim 1, wherein the multi-layered resistive element is electrically connected in series with the photodiode region.

10. The sensor of claim 1, wherein the sensor is configured to function with back-side illumination.

11. A sensor comprising:
    a semiconductor substrate;

a photodiode region arranged in the semiconductor substrate; and a multi-layered resistive element arranged over the semiconductor substrate and coupled with the photodiode region, wherein the multi-layered resistive element comprises a resistive random-access memory (ReRAM) structure.

12. The sensor of claim 11, wherein the photodiode region further comprising:

a P-type conductivity region, wherein the P-type conductivity region is coupled with an anode; and an N-type conductivity region, wherein the N-type conductivity region is coupled with a cathode, wherein the anode and the cathode are spaced apart from each other and are arranged over a periphery of the photodiode region and wherein the multi-layered resistive element is coupled with the P-type conductivity region of the photodiode region through the anode.

13. The sensor of claim 11, wherein the multi-layered resistive element comprises a metal oxide layer.

14. A method of forming a sensor comprising:

providing a semiconductor substrate;

forming a photodiode region in the semiconductor substrate; and forming a multi-layered resistive element over the semiconductor substrate and coupled with the photodiode region, wherein forming the multi-layered resistive element comprises forming a resistive random-access memory (ReRAM) structure.

15. The method of claim 14, wherein forming the multi-layered resistive element comprises:

forming a bottom electrode;

forming a resistive layer arranged over the bottom electrode; and forming a top electrode over the metal oxide layer.

16. The method of claim 14, wherein forming the multi-layered resistive element further comprises forming an interlayer dielectric (ILD) layer to embed the multi-layered resistive element.

17. The method of claim 14, further comprising:

forming an anode to couple with a P-type conductivity region of the photodiode region; and forming a cathode to couple with an N-type conductivity region of the photodiode region, wherein the anode and the cathode are spaced apart from each other and are arranged over a periphery of the photodiode region and wherein the multi-layered resistive element is coupled with the P-type conductivity region of the photodiode region through the anode.

18. The method of claim 17, wherein forming the multi-layered resistive element comprises forming the multi-layered resistive element arranged over and electrically coupled in series to the P-type conductivity region of the photodiode region through the anode.

19. The method of claim 15, wherein forming the resistive layer comprises forming a metal oxide layer.

20. The method of claim 15, wherein forming the resistive layer comprises forming an electrolyte layer and a cationic layer above the electrolyte layer.

* * * * *